United States Patent
Westbrook et al.

(10) Patent No.: US 6,320,688 B1
(45) Date of Patent: Nov. 20, 2001

(54) OPTICAL TRANSMITTER

(75) Inventors: Leslie D Westbrook, Southam; David G Moodie, Ipswich, both of (GB)

(73) Assignee: British Telecommunications Public Limited Company, London (GB)

( * ) Notice: Subject to any disclaimer, the term of this patent is extended or adjusted under 35 U.S.C. 154(b) by 0 days.

(21) Appl. No.: 09/068,524

(22) PCT Filed: Nov. 19, 1996

(86) PCT No.: PCT/GB96/02855

§ 371 Date: May 11, 1998

§ 102(e) Date: May 11, 1998

(87) PCT Pub. No.: WO97/19528

PCT Pub. Date: May 29, 1997

(30) Foreign Application Priority Data

Nov. 20, 1995 (GB) .................................................. 9523731

(51) Int. Cl.$^7$ ..................................................... H04B 10/04

(52) U.S. Cl. ....................... 359/181; 359/189; 359/245; 359/167; 359/184; 359/127; 359/182; 372/26

(58) Field of Search ........................... 359/245, 180–189, 359/161; 372/26

(56) References Cited

U.S. PATENT DOCUMENTS

| 5,165,105 | 11/1992 | Haase et al. ............................. 385/8 |
| 5,166,509 | 11/1992 | Curran ................................... 250/205 |
| 5,278,690 | * 1/1994 | Vella-Coleiro ........................ 359/152 |
| 5,359,679 | 10/1994 | Tanaka et al. ........................... 385/8 |
| 5,495,359 | * 2/1996 | Gertel et al. ........................... 359/245 |
| 5,625,636 | 4/1997 | Bryan et al. ............................ 372/50 |
| 5,659,565 | 8/1997 | Kitamura ................................. 372/43 |
| 5,784,188 | 7/1998 | Nakamura et al. .................. 359/248 |
| 5,793,782 | * 8/1998 | Meyrueix ................................ 372/26 |
| 6,008,926 | 12/1999 | Moodie et al. ........................ 359/238 |

| 6,097,525 | * 8/2000 | Ono et al. ............................. 359/181 |

FOREIGN PATENT DOCUMENTS

| 0 407 919 | 1/1991 | (EP) . |
| 0 437 836 A2 | 7/1991 | (EP) . |
| 0 484 791 | 5/1992 | (EP) . |
| 0 493 817 | 7/1992 | (EP) . |
| 0 658 016 | 6/1995 | (EP) . |
| WO 92 13291 | 8/1992 | (WO) . |

OTHER PUBLICATIONS

Morito et al, "High Power Modulator Integrated DFB Laser Incorporating Strain–Compensated/MQW and Graded SCH Modulator for 10Gbit/s Transmission", Electronics Letters, Jun. 8, 1995, vol. 31, No. 1: pp. 975–976.

Guy et al, "Low Repetition Rate Master Source for Optical Processing in Ultrahigh–Speed OTDM Networks", Electronics Letters, Sep. 28, 1995, vol. 31, No. 20, pp. 1767–1769.

Ellis et al, "40 Gbit/s Transmission Over 202 km of Standard Fibre Using Midspan Spectral Inversion", Electronics Letters, Feb. 16, 1995, vol. 31, No. 4, pp. 299–301.

(List continued on next page.)

Primary Examiner—Leslie Pascal
Assistant Examiner—Chau M. Nguyen
(74) Attorney, Agent, or Firm—Nixon & Vanderhye P.C.

(57) ABSTRACT

An optical transmitter includes a directly modulated semiconductor laser and a non-linear optical intensity modulator which is connected in series with the output of the laser. High frequency analogue modulating signals are applied both to the laser and to the modulator. The modulator has a transfer characteristic such that it cancels intermodulation distortion in the output from the laser, to give a source with an improved dynamic range. The transmitter is suitable for use in an analogue optical distribution system for cellular radio.

22 Claims, 7 Drawing Sheets

OTHER PUBLICATIONS

Moodie et al, "Generation of 6.3ps Optical Pulses at a 10GHz Repetition Rate Using a Packaged Electroabsorption Modulator and Dispersion Compensating Fibre", Electronics Letters, Sep. 29, 1994, vol. 30, No. 20, pp. 1700–1701.

Devaux et al, "Experimental Optimisation of MQW Electroabsorption Modulators with Up to 40 GHz Bandwidths", Electronics Letters, Aug. 4, 1994, vol. 30, No. 16, pp. 1347–1348.

Koren et al, "Low–Loss InGaAs/InP Multiple Quantum Well Optical Electroabsorption Waveguide Modulator", Appl. Phys. Lett. 51 (15), Oct. 12, 1987, pp. 1132–1134.

Tanaka et al, "5–Gb/s Performance of Integrated Light Source Consisting of $\lambda$/4–Shifted DFB Laser and EA Modulator with SI InP BH Structure", Journal of Lightwave Technology, vol. 8, No. 9, Sep. 1990, pp. 1357–1362.

Moodie et al, "Multiquantum Well Electroabsorption Modulators for 80 Gbit/s OTDM Systems", Electronic Letters, Aug. 3, 1995, vol. 31, No. 16, pp. 1370–1371.

Moodie et al, "Discrete Electroabsorption Modulators with Enhanced Modulation Depth", Journal of Lightwave Technology, vol. 14, No. 9, Sep. 1996, pp. 2035–2043.

Devaux et al, "High–Speed, InGaAsP/InP Multiple Quantum Well, 1.55$\mu$m Singlemode Modulator", Electronics Letters, 27 (1991) Oct. 10, No. 21, Stevenage, Herts., GB, pp. 1926–1927.

IEEE Photonics Technology Letters, vol. 7, No. 10, Oct. 1995, New York, US, pp. 1154–1156, Wilson et al, "Integrated Electrabsorption Modulator/DBR Laser Linearized by RF Current Modulation".

Journal of Lighwave Technology, vol. 13, No. 8, Aug. 1995, New York, US, pp. 1606–1612, Iwai et al, "Signal Distortion and Noise in AM–SCM Transmission Systems Employing the Feedforward Linearized MQW–EA External Modulator".

IEEE Photonics Technology Letters, vol. 3, No. 9, Sep. 1991, New York, US, pp. 844–846, Suto et al, "Intermodulation Distortion in 48 TV Channel FM–FDM Optical Transmission".

IEEE Photonics Technology Letters, vol. 6, No. 9, Sep. 1994, New York, US, pp. 1150–115, Wu et al, "A Fiber Distribution System for Microcellular Radio".

* cited by examiner

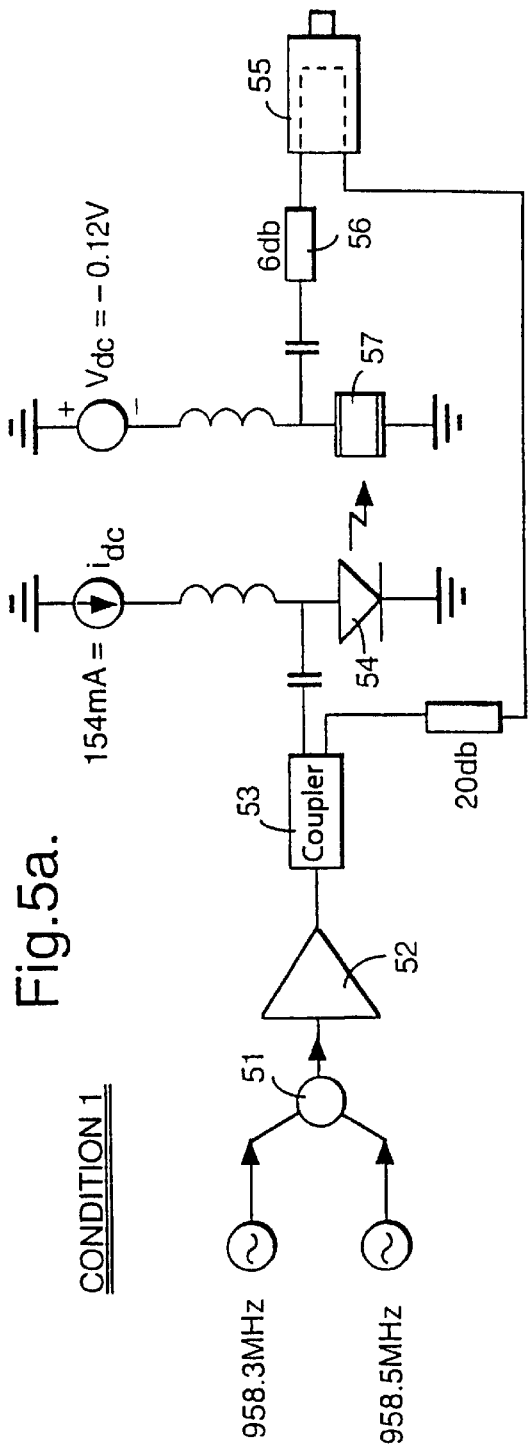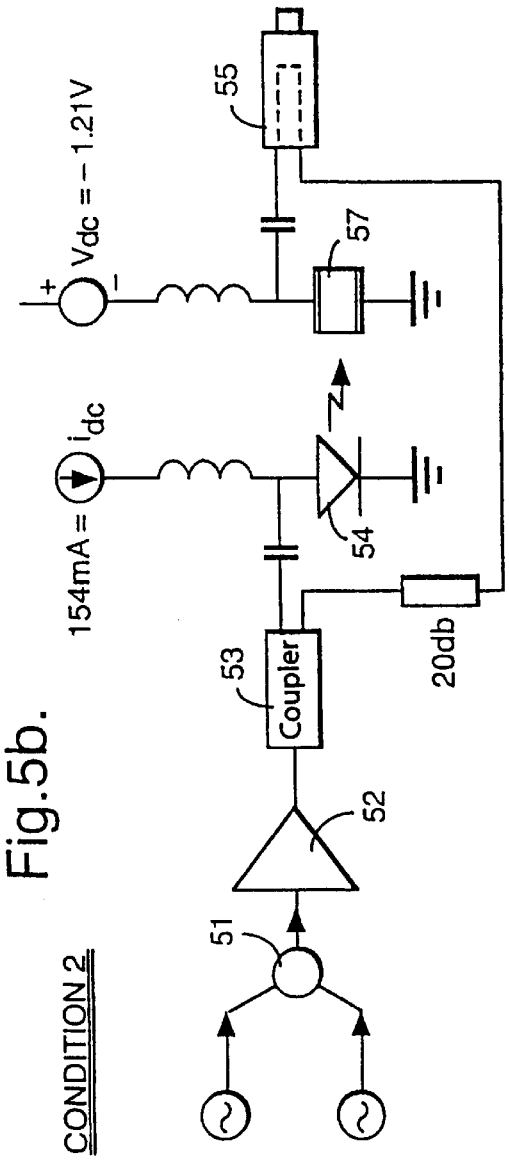

OPTICAL TRANSMITTER

BACKGROUND OF THE INVENTION

1. Field of the Invention

The present invention relates to an optical transmitter, and in particular to a transmitter suitable for use in the transmission and distribution of analogue optical signals modulated at RF or microwave frequencies.

2. Description of Related Art

The low losses and EMI immunity associated with optical fibres, makes their use an attractive proposition, for example, in the distribution of signals to remote transmitter sites in a cellular radio system. The optical transmitters used hitherto with such optical fibre links have either been in the form of directly modulated laser diodes, or have comprised continuous wave lasers coupled with a separate electro-optic modulator such as a Mach-Zehnder intensity modulator or an electroabsorption modulator. Such optical transmitters suffer however, from a dynamic range which is significantly inferior to that of the electronic devices commonly used in cellular base stations. This has restricted the use of optical analogue links.

For a given received optical power, the dynamic range of analogue opticalfibre links is limited primarily by the linearity of the electrical to optical transfer characteristic of the optical transmitter. It has previously been proposed to use schemes such as electrical pre-distortion or optical feedforward linearisation to increase the overall system dynamic range. It would be desirable however to improve the intrinsic source linearity. In the context of a source using a continuous wave laser followed by a Mach-Zehnder modulator, it has been proposed to use two modulators in cascade in order to improve linearity [Betts. G.E. IEEE Trans. Microwave Theory & Techniques, vol 42 no. 12 pp 2642–2649]. By feeding an RF drive signal to both modulators in a prescribed ratio, the second modulator corrects for the distortion of the first.

BRIEF SUMMARY OF THE INVENTION

According to a first aspect of the present invention, there is provided an optical transmitter comprising:

a) a directly modulated semiconductor laser including an input for a high frequency analogue electrical modulating signal; and b) a non-linear optical intensity modulator which is connected in series with the optical output of the laser and which includes an input for a high frequency analogue electrical modulating signal corresponding to the signal applied to the laser, the modulator having a transfer characteristic arranged to cancel at least partially intermodulation distortion in the optical signal output by the laser.

The present invention provides a directly modulated laser source with an intrinsically improved linearity. This achieved by using a modulator following the directly modulated laser having distortion characteristics which tend to cancel the distortion produced by the laser.

Preferably the modulator is an electroabsorption modulator preferably integrated with the semiconductor laser. Preferably the laser is a multi-quantum well (MQW) distributed feedback (DFB) laser, and the modulator is an MQW electroabsorption modulator.

The preferred implementation of the present invention uses monolithically integrated components which together form a compact, single-chip linearised analogue source. This arrangement offers superior RF phase stability by comparison with implementations using discrete devices. Furthermore, the non-linearity of electro absorption modulators is highly controllable, making them ideal for the task of linearising a DFB laser.

Alternatively, the electro-optic modulator may be a Mach-Zehnder device which may be a planar device.

The modulator may have a predetermined characteristic chosen to be complementary to the expected characteristics of the modulated source. Preferably however the modulator is actively controlled to linearise the output signal. Preferably the system comprises a detector for monitoring the output of the transmitter, and means for supplying a control input to the modulator dependent on the output of the detector. The detector may be arranged to detect, for example, the third harmonic of the output signal, and to drive the modulator in a feedback loop to minimise this output.

BRIEF DESCRIPTION OF THE DRAWINGS

Systems embodying the present invention will now be described in further detail, by way of example only, with reference to the accompanying figures in which:

FIGS. 5a and 5b are schematics showing in further detail the circuits embodying the present invention;

DETAILED DESCRIPTION OF THE INVENTION

Figure 1:
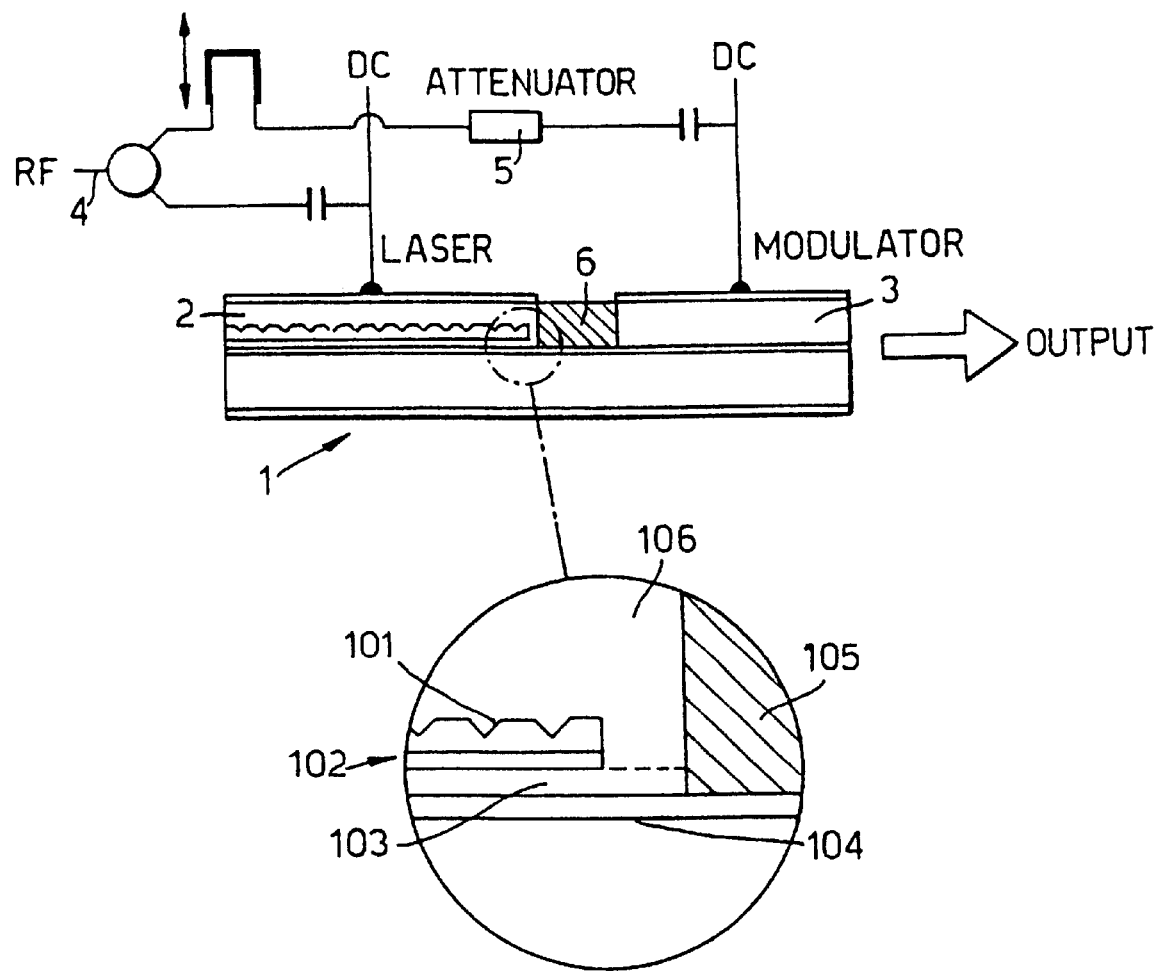
FIG. 1 is a schematic of a laser/EA modulator embodying the present invention.

An optical transmitter 1 comprises a directly modulated semiconductor laser 2 and an optical intensity modulator 3 connected in series with the optical output of the laser. An RF source 4 generates a modulating voltage which is superimposed on a dc bias applied to the laser and to the modulator. An attenuator 5 connected in series between the RF source and the gate of the modulator 3 is used to set a predetermined ratio between the amplitude of the modulating signal applied to the modulator and that applied to the laser. The modulator has a transfer characteristic which, for small signals over a selected range of bias voltages is generally complementary to that of the laser, and so is able to cancel intermodulation distortion generated by the laser.

The enlarged detail shows a grating layer 101, MQW active layer 102, n-InP spacer layer 103, electroabsorption layer 104, Fe InP region 105 and p InP region 106.

Figure 2:
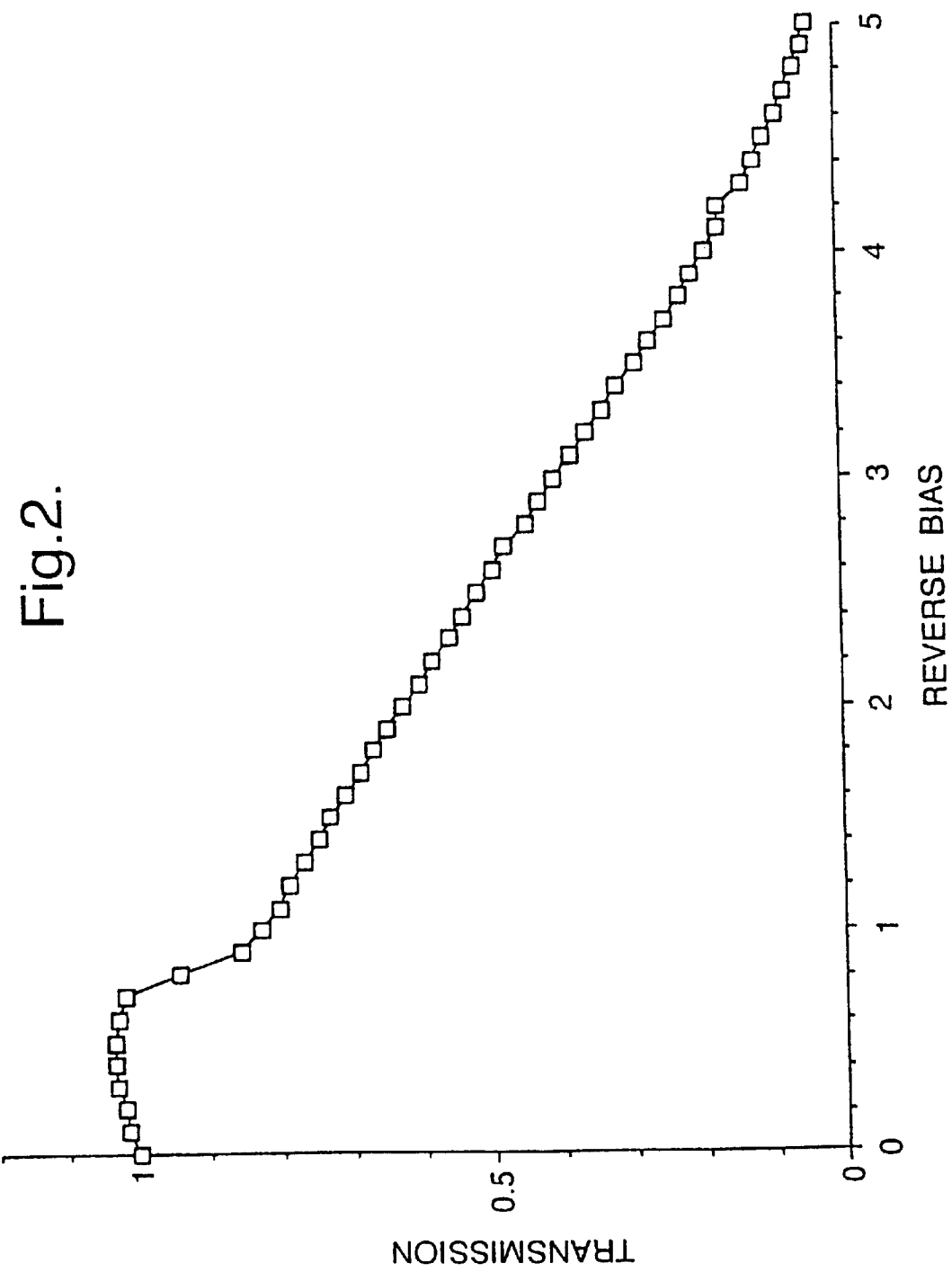
FIG. 2 is a graph showing the transmission characteristic of the modulator of FIG. 1.

In the present example, the transmitter comprises an integrated DFB laser/EA modulator, as shown schematically in FIG. 1. It has a 395 μm long InGaAs/InGaAsP MQW DFB laser section and a 190 μm long InGaAsP/InGaAsP MQW EA modulator section separated by a 100 μm passive waveguide section 6. Modulator and laser epitaxial layers were grown sequentially, separated by a 0.2 μmInP spacer layer, by MOVPE. The laser epi-layers were selectively removed from above the modulator and passive waveguide sections and mesas etched prior to the growth of a high resistivity Fe-doped, InP layer providing current blocking and isolation between the sections. The finished chip is packaged in a 14-pin high speed connectorised module with welded-in lens-ended fibre. Measured CW side mode suppression ratio was >40 dB and electrical isolation between the DFB and EA modulator sections was 2 MΩ. The DC modulator transmission characteristic (normalised to 0V) is shown in FIG. 2 as a function of the modulator reverse bias.

Figure 6:
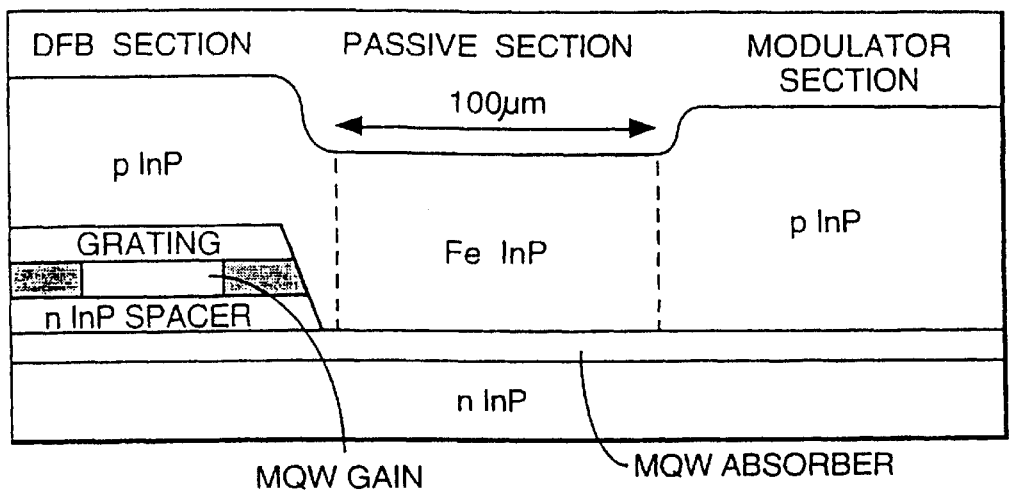
FIG. 6 is a cross-section showing in detail the laser/modulator of FIG. 1.
Figure 7:
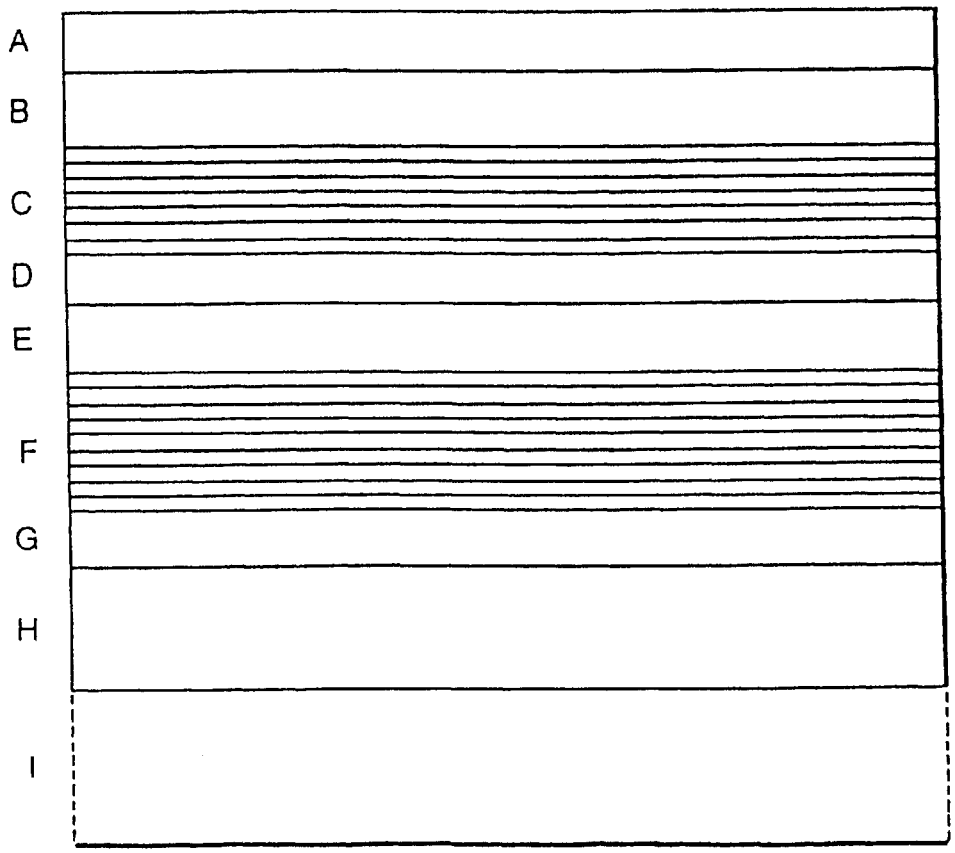
FIG. 7 shows the crystal structure used in the fabrication of the device of FIG. 1.

The cross-section of the device is shown in further detail in FIG. 6, and the crystal structure used in the fabrication of the device is shown in FIG. 7. It consists of the layers necessary to make a DFB laser grown on top of the layers necessary to form an EA modulator. The growth technique used, as noted above, is MOVPE. Post growth analysis showed that the peak photoluminescence wavelength of the absorber layer was 1.5 μm, as required. In fabricating the device, second order gratings with quarter wavelength phase shifts are formed on the sample using electron-beam lithography. The device is then formed with steps of photolithography and overgrowth. An economy of process steps is achieved by designing the laser and modulator sections to be buried heterostructures with Fe-doped InP current blocking structures, thus enabling them to share mesa definition, Fe-doped InP overgrowth, P-contact layers overgrowth and metallisation stages. An additional photolithography step is needed to remove the laser layers from the modulator and passive sections prior to mesa definition. An overgrowth step involves the deposition of 1 μm of Fe-doped InP in the passive region to electrically isolate the laser and modulator sections. This is carried out after the P-contact lasers are removed from everywhere except above the active stripe in the laser and modulator regions.

In this example the width of the absorber layer in the modulator section was estimated from SEM (scanning electron microscope) analysis to be 1.7 μm. The slice was thinned to 90 μm. Bars were cleaved off and coated with multi-layer anti-reflection coatings at both facets, before being scribed up into individual chips for characterisation and packaging.

In the final packaged form of the transmitter, the chip sits p-side up on a metallised diamond. A low impedance path is provided from the diamond to the ground plane of the package which serves as the negative electrical terminal of the DFB and the positive terminal of the reverse-biased modulator. The package incorporates a thermistor and a Peltier cooler so that the chip temperature can be controlled. A wide bandwidth (40 GHz) K-type connector is used to provide a high speed electrical contact to the p-side of the modulator. A dc electrical contact is made to the p-side of the DFB. To measure the performance of the transmitter, a photodiode is placed near the DFB facet to enable the laser output to be monitored directly.

Figure 3A:
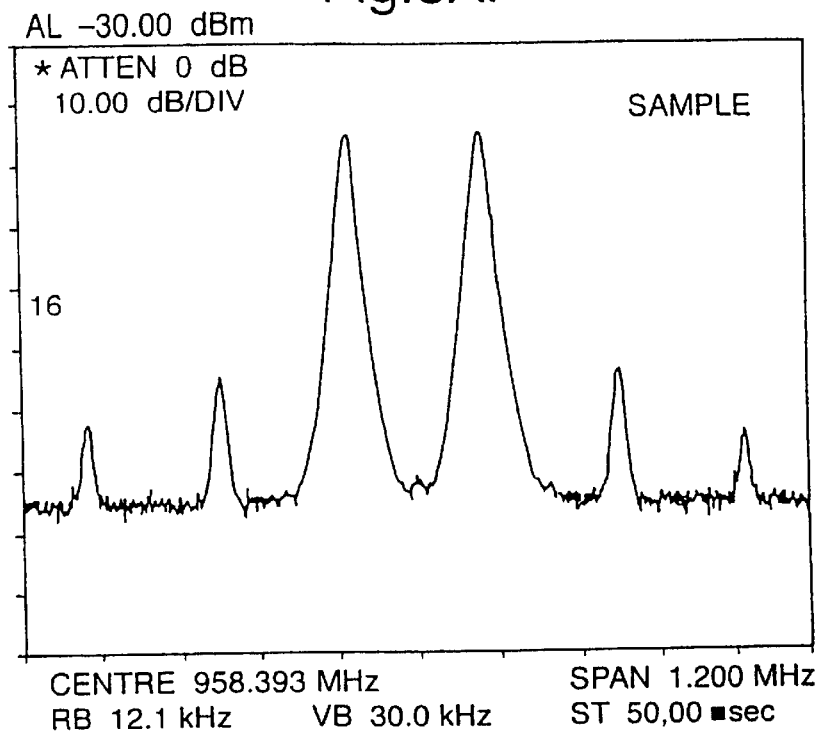
FIGS. 3a and 3b are spectra detecting the output of the device of FIG. 1.
Figure 3B:
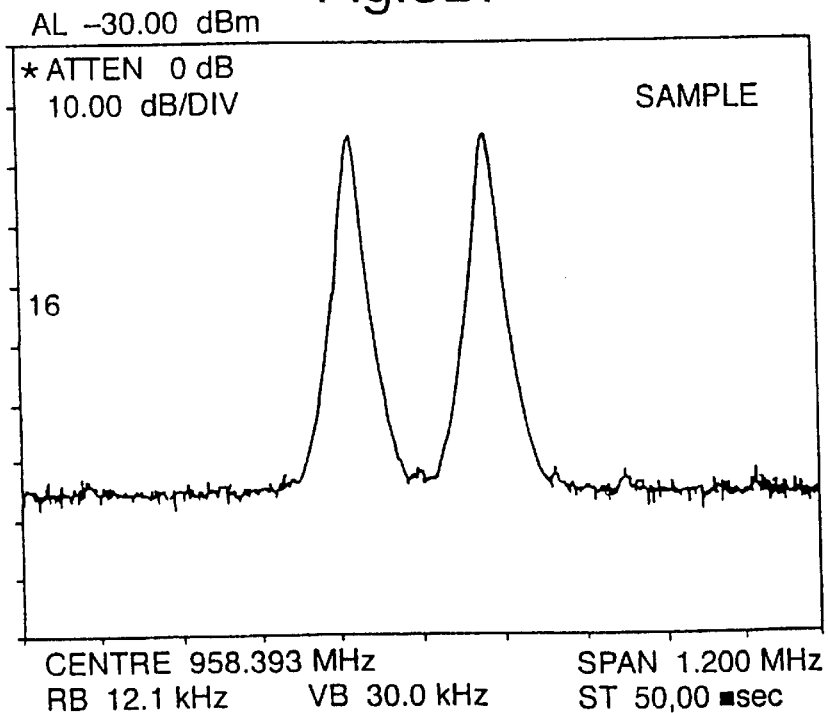

FIGS. 3a and 3b illustrate the performance of the transmitter. Standard two-tone tests were carried out on the laser-EA modulator device at RF frequencies relevant to fibre-fed GSM cellular radio (centre frequency around 950 MHz, carrier separation equal to 200 kHz). A power divider was used to split the RF between the laser and the modulator, the latter being fed via the attenuator 5 and a phase adjuster.

The detected spectrum with RF applied to the laser only, is shown in FIG. 3a for a modulator bias of −1.21 V. Initial adjustments to the fixed attenuator (coarse) and modulator bias (fine) were made, with RF to the modulator section only, so that the third and fifth-order intermodulation products were approximately the same amplitude as those with the RF applied to the laser only, but with a much lower detected signal level. Following this, with the RF applied to both devices, the modulator bias was optimised to achieve maximum distortion cancellation. The detected spectrum of FIG. 3b shows clearly the cancellation of both third and fifth-order intermodulation products when the bias is optimised, yet the detected carrier level is within 1 dB of that measured without distortion cancellation.

Figure 4:
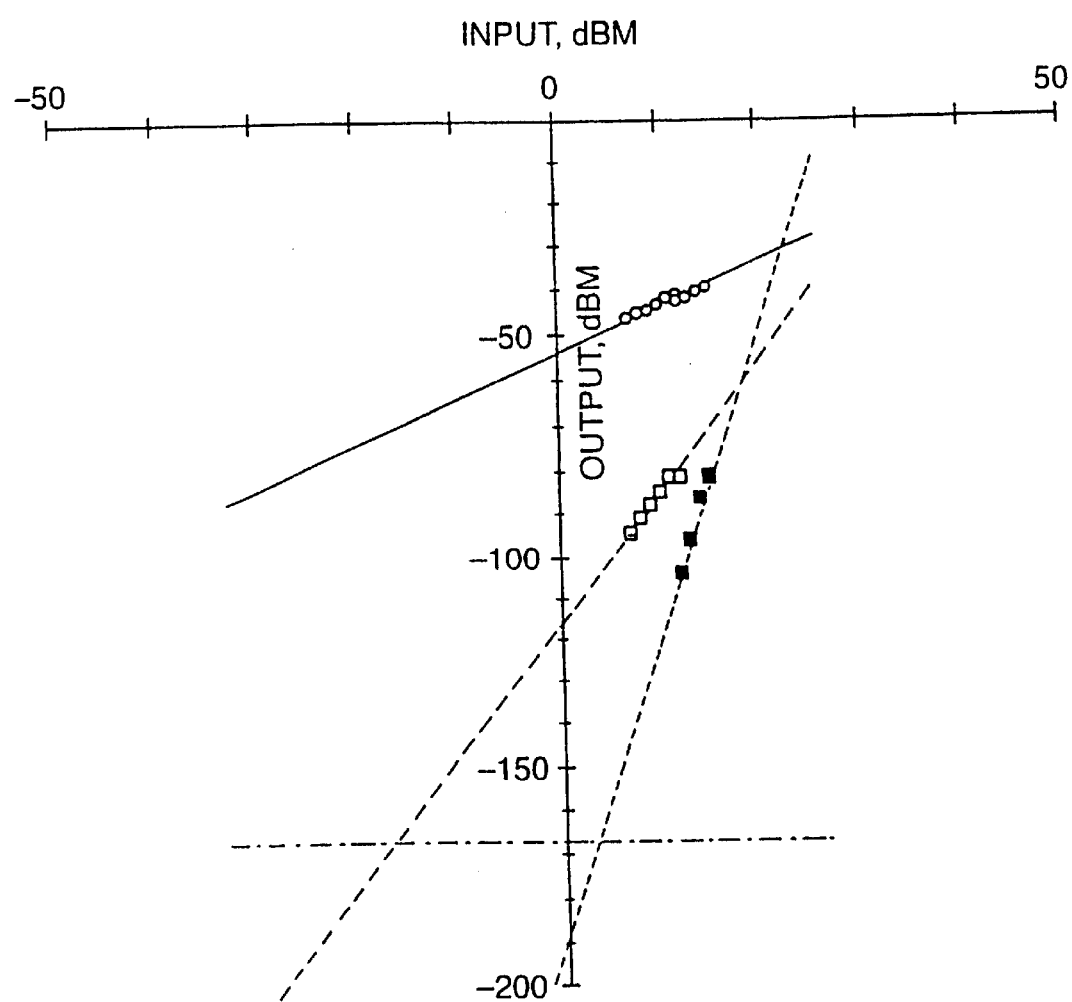
FIG. 4 is a graph showing the dependence of distortion on input RF power.

More than one combination of attenuator and bias voltage resulted in distortion cancellation. In a further example, a bias of −0.12 V was applied to the modulator and an attenuation ratio of 26 dB used. Again cancellation of the intermodulation products was achieved. FIG. 4 shows the dependence of the third order intermodulation distortion with input RF power for this modulator bias of −0.12 V with and without the RF applied to the modulator. The receiver in this case was a simple pin photodiode terminated with 50Ω. The photo current in this measurement was 0.9 mA giving a shot-noise dominated noise floor of −167 dB.Hz. Distortion cancellation results in an improvement of the spurious-free dynamic range (SFDR) from 96 dB.Hz$^{2/3}$ to 117 dB.Hz$^{6/7}$.

FIGS. 5a and 5b show in further detail the two configurations used to obtain the results discussed above. In these circuits, drive signals are combined in a power combiner 51 and passed through an amplifier 52. The resulting signal is split by a 3 dB coupler 53. One part of the signal is then coupled into the drive to the laser diode 54. The dc bias current $i_{dc}$ is 154 mA. The other part of the signal passes through a 20 dB attenuator and a control stage 55 and is coupled to the control input of the electro-optic modulator. In the case of FIG. 5a, a further attenuator 56 is included in the signal path to the modulator 57. The control stage 55 may comprise a microwave phase adjuster to adjust the phase of the drive to the modulator to match that of the drive to the laser. In this example, the stage comprises a pair of microwave strip lines which are moved relative to each other to provide the required phase change. In addition, as shown schematically in FIG. 9, feedback from the optical output of the transmitter may be used to control the bias applied to the modulator. To facilitate this, two rf tones may be added resistively to the drive signal. An optical coupler at the output of the transmitter is then used to split off a small fraction of the output power. This is filtered to select the difference frequency of the two rf tones, passed through a rectification diode and amplified to produce a control signal for the modulator at an appropriate level.

Figure 8:
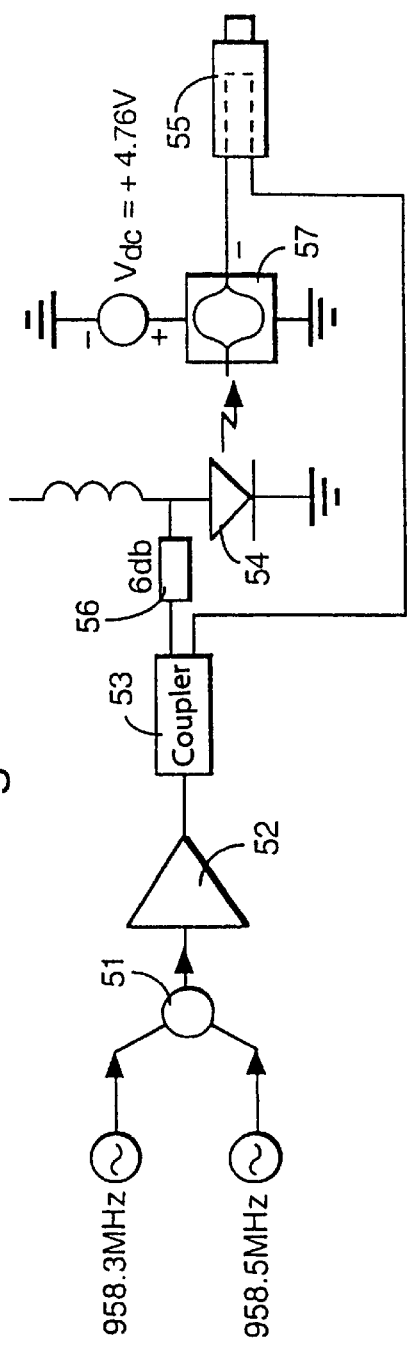
FIG. 8 is a schematic of an alternative embodiment.

FIG. 8 shows an alternative embodiment, in which the electro-optic modulator is a Mach-Zehnder planar device available commercially as GEC Advanced Optical Products Y-35-8931-02. A directly modulated DFB semi-conductor laser was used as the optical source.

Figure 9:
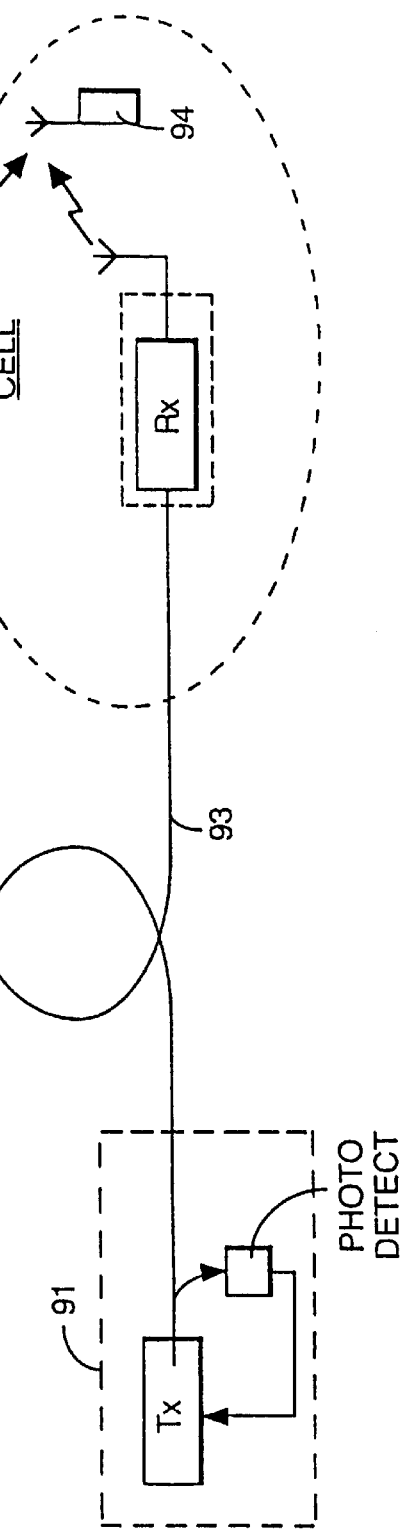
FIG. 9 is a diagram showing a cellular radio system incorporating an optical transmitter embodying the present invention.

As noted above, the transmitter of the present invention is particularly suitable for use in an analogue optical link within a cellular radio system. FIG. 9 illustrates such a system a transmitter such as that illustrated in FIG. 1 is located in a central station 91 linked to a number of GSM cellular base stations 92 by optical fibre links 93 (for ease of illustration a single link and base station are shown in the figure). At the cellular base station, the optical RF carrier signal is converted to an electrical RF signal for transmission to mobile stations 94. This may be done, for example, using the techniques disclosed in the paper by H.Ogawa, Trans. on Microwave Theory and Techniques, Vol.39, No.12, Dec 1991, pp 2045–2051.

TABLE 1

| LAYER | MATERIAL | THICKNESS |
|---|---|---|
| A: Substrate | n InP S-doped $1 \times 10^{18} \text{cm}^{-3}$ | 300 μm |
| B: Buffer layer | n InP S-doped $1 \times 10^{18} \text{cm}^{-3}$ | 3 μm |
| C: Confinement layer | Q1.10 undoped 200Å thick | total of 0.215 μm with layer D |
| D: MQW absorber layer | 13 periods of undoped Q1.59 wells 95Å thick and undoped Q1.10 barriers 55Å thick | total of 0.215 μm with layer C |
| E: Spacer layer | n InP S-doped $1 \times 10^{16} \text{cm}^{-3}$ | 0.2 μm |
| F: Confinement layer | Q1.30 undoped 100Å thick | total of 0.138 μm with layer G |
| G: MQW gain layer | 8 periods of undoped ternary wells 80Å thick and undoped Q1.30 barriers 80Å thick | total of 0.138 μm with layer F |
| H: Grating layer | p Q1.10 Zn-doped $5 \times 10^{17} \text{cm}^{-3}$ | 0.2 μm |
| I: Cap layer | p InP Zn-doped $5 \times 10^{17} \text{cm}^{-3}$ | 0.05 μm |

What is claimed is:

1. An optical transmitter comprising:
   (a) a primary input port for receiving an input signal, said input signal being a high frequency and analogue electrical signal,
   (b) a directly modulated semi-conductor laser having a modulation input connected to said primary input port, and
   (c) a non-linear optical intensity modulator optically connected in series with an optical output of said laser, said modulator having a modulator port connected to the primary input port, said modulator having a transfer characteristic arranged to cancel at least partially intermodulation distortion in the optical signal output of the laser,
   (d) wherein a controlled ratio is set between the amplitudes of the signal applied to the modulation input of the laser and a modulating signal applied to the modulator port of the modulator, and an output of the modulator includes modulation by both said laser and said modulator.

2. A transmitter according to claim 1, in which the modulator is an electroabsorption modulator.

3. A transmitter according to claim 2, in which the electroabsorption modulator is integrated with the semiconductor laser.

4. A transmitter according to claim 1, in which the laser is a DFB laser.

5. A transmitter according to claim 4, in which the laser is a multi-quantum well (MQW) distributed feedback (DFB) laser and the modulator is an MQW electroabsorption modulator.

6. A transmitter according to claim 1, in which the modulator is a Mach-Zehnder device.

7. A transmitter according to claim 1, further comprising a control circuit for actively controlling the modulator to linearise the optical output signal.

8. A transmitter according to claim 7, in which the said control circuit comprises a detector for monitoring the output of the transmitter, and the output of the control circuit is connected to a control input to the modulator and in use applies to the control input a control signal which depends on the output of the detector.

9. A cellular radio system including an analogue optical link between a central station and a remote base station, in which the central station includes an optical transmitter according to claim 1 arranged to generate a modulated optical signal for transmission on the analogue optical link.

10. An optical transmitter according to claim 1, further comprising an attenuator connected between said primary input port and said modulator port of said modulator.

11. An optical transmitter according to claim 1, wherein the output of the modulator includes both modulation distortion applied by said laser and canceling distortion applied by the modulator.

12. A transmitter according to claim 7, wherein the optical output signal is linearized by minimizing third and/or fifth harmonics in the optical output signal.

13. A method of generating an optical signal modulated with an input signal, said input signal being a high frequency analogue electrical signal, said method comprising:
   (a) generating an optical signal in a semiconductor laser,
   (b) inputting said input signal into said laser and thereby modulating the optical output of said laser with said input signal,
   (c) inputting said modulated optical output into a non-linear optical intensity modulator connected in series with said semiconductor laser, said modulator having a transfer characteristic arranged to cancel at least partially intermodulation distortion applied by said laser, and
   (d) inputting a signal originating from said input signal into said intensity modulator;
   wherein a controlled ratio is set between the amplitudes of the modulating input of said laser and said signal input to said modulator, and the output of the modulator includes modulation applied by both the laser and the modulator.

14. A method according to claim 13, further comprising actively controlling the modulator and thereby linearizing the optical signal.

15. A method according to claim 14, in which the step of actively controlling includes:
   i) detecting an optical output of the transmitter; and
   ii) varying in dependence upon the said optical output a control input which is applied to the modulator.

16. A method according to claim 14, wherein the optical signal is linearized by minimizing third and/or fifth harmonics in said optical signal.

17. A method of operating a cellular radio system comprising:
   a) at a central station, generating a high frequency analogue optical signal by a method according to claim 13,
   b) transmitting the said optical signal over a analogue optical link to a remote base station; and
   c) subsequently deriving from said optical signal a radio frequency signal in the electrical domain for radio transmission from the remote base station.

18. A method according to claim 13, wherein said controlled ratio is set by attenuating said input signal and providing the attenuated signal to said modulator.

19. A method according to claim 13, where the output of the modulator includes both modulation distortion applied by said laser and canceling distortion applied by the modulator.

20. A method of generating an optical signal modulated with an input signal, said input signal being a high frequency analogue electrical signal, said method comprising:
   (a) generating an optical signal in a semiconductor laser,
   (b) inputting said input signal into said laser and thereby modulating the optical output of said laser with said input signal, (c) inputting said modulated optical output into a nonlinear optical intensity modulator connected in series with said semiconductor laser, said modulator having a transfer characteristic arranged to cancel at least partially intermodulation distortion applied by said laser, and (d) attenuating said input signal by a controlled ratio and inputting said attenuated signal into said intensity modulator;

whereby the output of the modulator includes both modulation applied by the laser and the modulator.

21. A method according to claim 20, wherein said modulator having a transfer characteristic arranged to cancel at least partially intermodulation distortion applied by said laser.

22. A method according to claim 20, wherein the output of the modulator includes both modulation distortion applied by said laser and canceling distortion applied by the modulator.

* * * * *